US010127342B2

(12) United States Patent
Xin et al.

(10) Patent No.: US 10,127,342 B2
(45) Date of Patent: Nov. 13, 2018

(54) METHOD OF DESIGNING AND MODIFYING LITHIUM ION BATTERY CATHODE MATERIALS

(71) Applicant: Nano and Advanced Materials Institute Limited, Hong Kong (HK)

(72) Inventors: Jianzhuo Xin, Hong Kong (HK); Wing Yu Chau, Hong Kong (HK); Yingkai Jiang, Hong Kong (HK); Yeming Xu, Hong Kong (HK); Kwok Keung Ho, Hong Kong (HK)

(73) Assignee: Nano and Advanced Materials Institute Limited, Hong Kong (HK)

( * ) Notice: Subject to any disclaimer, the term of this patent is extended or adjusted under 35 U.S.C. 154(b) by 462 days.

(21) Appl. No.: 15/093,763

(22) Filed: Apr. 8, 2016

(65) Prior Publication Data

US 2017/0293707 A1    Oct. 12, 2017

(51) Int. Cl.
*G06G 7/54* (2006.01)
*G06F 17/50* (2006.01)
(Continued)

(52) U.S. Cl.
CPC ...... *G06F 17/5068* (2013.01); *H01M 4/0404* (2013.01); *H01M 4/131* (2013.01); *H01M 4/1391* (2013.01); *H01M 4/382* (2013.01); *H01M 4/505* (2013.01); *H01M 4/525* (2013.01); *H01M 4/623* (2013.01); *H01M 4/625* (2013.01); *H01M 4/661* (2013.01); *H01M 10/0525* (2013.01); *H01M 10/0568* (2013.01); *H01M 10/0569* (2013.01); *H01M 10/0585* (2013.01); *H01M 2004/027* (2013.01); *H01M 2004/028* (2013.01); *H01M 2300/004* (2013.01)

(58) Field of Classification Search
CPC .................................................. G06F 17/5068
USPC ......................................................... 703/18
See application file for complete search history.

(56) References Cited

U.S. PATENT DOCUMENTS

7,945,344 B2    5/2011    Wang et al.
8,301,285 B2    10/2012    Zhang et al.
(Continued)

OTHER PUBLICATIONS

Venkatasailanathan Ramadesigan, et al, Modeling and Simulation of Lithium-Ion Batteries from a Systems Engineering Perspective, Journal of the Electrochemical Society, 159 (3) R31-R45 (2012).

*Primary Examiner* — Timothy A Mudrick
(74) *Attorney, Agent, or Firm* — Spruson & Ferguson (Hong Kong) Limited

(57) ABSTRACT

A method of designing and modifying electrode materials for a battery device is disclosed in this invention. The method includes constructing a first principle model for battery electrode material properties estimation and screening. The method also includes applying a structural and compositional modification on the first principle model. In some embodiments, the method includes developing a hybrid physical model to estimate the battery cell cycling behavior with the calculated and experimental parameters. The method and the simulation models have the advantage that both atomic level and physical structure will be considered for the battery electrode and its modified derivatives with small compositional or structural changes. Therefore, both the time consumption and accuracy for battery electrode material designing and modification for specific application requirements can be improved.

14 Claims, 7 Drawing Sheets

(51) Int. Cl.
  *H01M 4/04*       (2006.01)
  *H01M 4/131*      (2010.01)
  *H01M 4/1391*     (2010.01)
  *H01M 4/38*       (2006.01)
  *H01M 4/505*      (2010.01)
  *H01M 4/525*      (2010.01)
  *H01M 4/62*       (2006.01)
  *H01M 4/66*       (2006.01)
  *H01M 10/0525*    (2010.01)
  *H01M 10/0568*    (2010.01)
  *H01M 10/0569*    (2010.01)
  *H01M 10/0585*    (2010.01)
  *H01M 4/02*       (2006.01)

(56) References Cited

U.S. PATENT DOCUMENTS

| | | | |
|---|---|---|---|
| 2011/0054816 A1* | 3/2011 | Prada | G01R 31/3624 |
| | | | 702/63 |
| 2012/0130690 A1 | 5/2012 | Srivastava et al. | |
| 2012/0130691 A1* | 5/2012 | Li | G01R 31/3651 |
| | | | 703/2 |
| 2012/0130692 A1* | 5/2012 | Li | H01M 10/052 |
| | | | 703/2 |
| 2016/0028062 A1* | 1/2016 | Kim | H01M 10/0585 |
| | | | 429/223 |

* cited by examiner

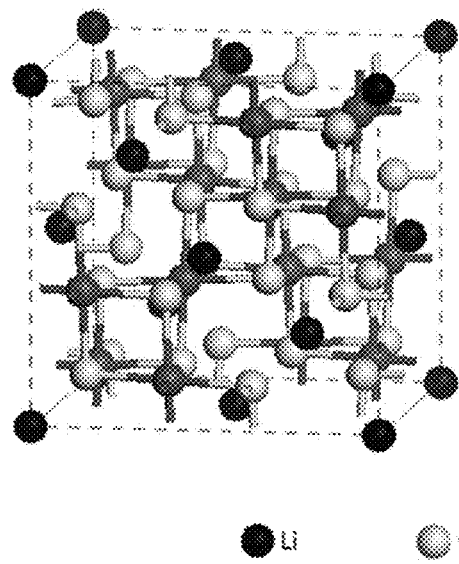
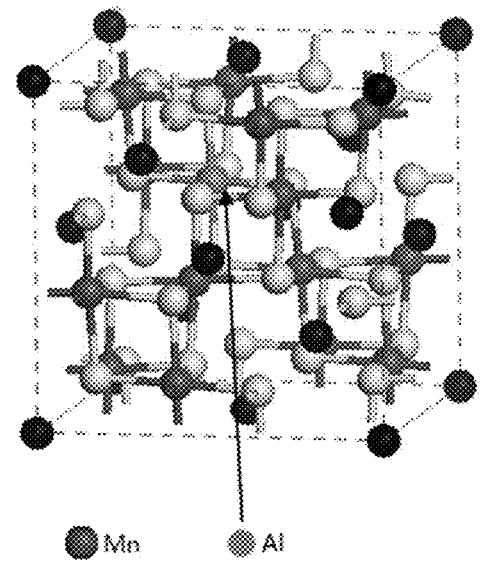
Figure 8A  Figure 8B
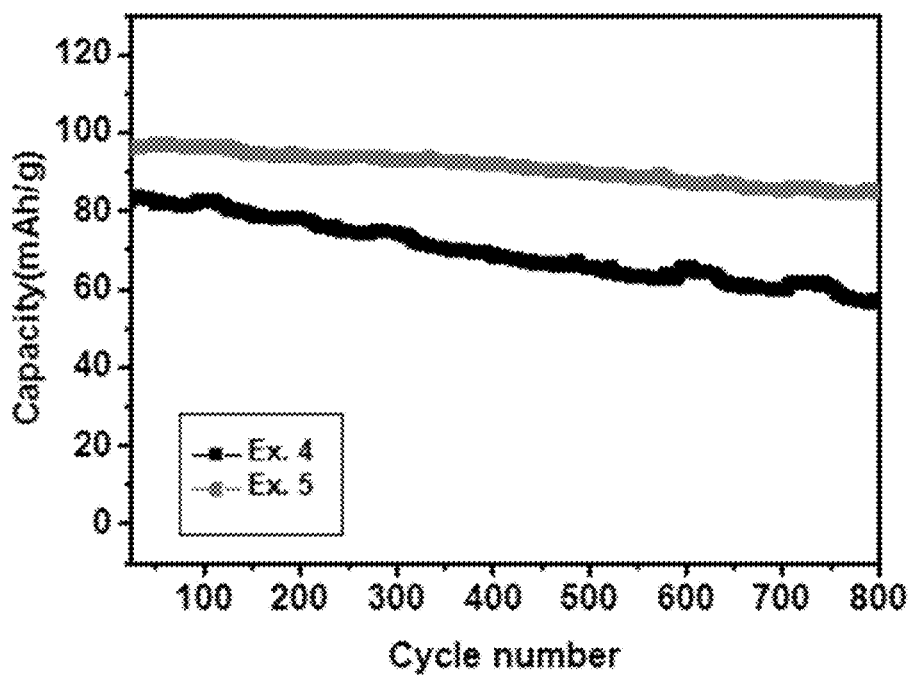
Figure 9

METHOD OF DESIGNING AND MODIFYING LITHIUM ION BATTERY CATHODE MATERIALS

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

This invention relates to designing and modifying electrode material for battery cells. More particularly, this invention provides a method to develop and improve performance features for lithium ion battery in specific applications through a computer-aided simulation approach.

BACKGROUND OF THE INVENTION

In the past decades, Lithium-ion battery (LIB) has been widely utilized in various applications especially consumer electronics, due to their superior energy density, long life type and discharging capability. Market has witnessed the tremendous increase since the first LIB was developed by SONY in 1991.

Lithium-ion batteries typically include an anode, an electrolyte, and a cathode that contains lithium in the form of a lithium-transition metal oxide, such as $LiCoO_2$, $LiNiO_2$ and $LiMn_2O_4$. Currently, lithium-ion batteries mostly utilize metal oxides as cathode material with $LiCoO_2$ as the most popular and commercially successful representative. However, due to the intrinsic material properties of this cathode material, besides the toxicity and high material cost of cobalt, further enhancement of LIB performance is also limited. $LiNiO_2$ is characterized for its high specific capacity up to 180 mAh/g. But its application is limited to experimental research because of difficulties in synthesis and safety concerns due to the thermal runaway reaction. $LiMn_2O_4$ has been considered as a promising cathode due to its advantages of high stability and low cost. However its low charge capacity and inferior cycling performance, especially under high temperatures, limit the application of this material to small electrokinetic cells.

In recent years, multi-element lithium transition metal oxides $Li[Ni_xMn_yCo_{1-x-y}O_2]O_2$ (LNMC) and $xLi_2MnO_3 \cdot (1-x)Li[Ni_xMn_yCo_{1-x-y}]O_2$ or called "Lithium-rich layered oxide" (LLO) have been proposed to replace existing battery cathodes. While the LNMC ternary lithium metal oxide is expected to leverage merits of each component material and might even prevail in the overall performance, LLO has the potential to provide much higher specific capacity than existing cathode materials up to ~300 mAh/g. Nevertheless, there are still some drawbacks in the multi-transition metal oxides cathode materials to be improved, for instance, phase transformation and thermal stability related safety issue for LNMC as well as the large irreversible first cycle capacity and fast deterioration of capacity after repeated charge and discharge cycles for LLO. Therefore, it is clear that existing single structured cathodes cannot deliver "perfect" performance for various application requirements. Tremendous efforts are still underway to develop new cathode or modify the existing structures for performance improvement or customization to fit the need of specific applications.

Conventional battery design is generally performed by an empirical approach. Designers propose specifications of a battery design, make batteries accordingly in a small research and development environment, and test the performance of the batteries. This process is iterated for incremental improvement of battery performances. Furthermore, the identified optimal design for one application usually does not apply to others. In other words, the whole empirical, iterative, costly and time-consuming design process needs to be repeated for different applications. Significant efforts are currently underway, mainly in the academic community and Department of Energy laboratories to use computer based computational methods simulations to accelerate the search for new and better materials for the battery industry. A major theme for much computational work has been the strong synergy with experimental studies. In literatures, density functional theory (DFT) has been used to predict the cell voltage changes and the battery charging/discharging behavior.

U.S. Patent Application No. US 2012/0130690 A1 describes a method and computer programs for selecting electrode material for a lithium ion battery. The invention discloses a general development approach for battery materials combining Quantum Simulation (QS) and equivalent circuit modeling and a database including the performance properties of typical electrode material structures. The microscopic material properties such as specific capacity for battery, cell voltage, lattice constants, lattice volume change and even X-ray diffraction (XRD) or Neutron Diffraction (ND) can be simulated by the developed algorithm and then the discharging behavior of a battery half-cell made from the electrode material can be derived from either the data obtained from QS calculation or from experiment. However this method is mainly limited to the fundamental material properties estimation without considering the parameters more related to the full-cell electrical behavior, such as electrode material packing density, lithium ion diffusivity in the active/inactive electrode materials, and lithium ion diffusion pathways. Furthermore, the method and databased disclosed in this invention focus only on the properties screening of given material structure and compositions without involving the need to simulate the modifications of given material such as doping and surface capping on the particulates.

U.S. Pat. No. 7,945,344 B2 describes a method to design a battery system for manufacturing by using a computational approach. A three dimensional model of battery comprising the basic battery element is built to correlating a series of electrical, thermal, mechanical, transport, or kinetic characteristics of the cell to the battery material properties such as the size, shape, composition and potential interface interactions. By optimizing the performance factors to the predetermined range, one or more required material properties including anode, cathode, separator and current collectors can be determined for manufacturing. However, this invention focuses only on the effects of material geometric and compositional factors in the battery cell structure as the guidance for battery manufacturing. No designing and optimization of the battery material structure is considered.

U.S. Pat. No. 8,301,285 B2 describes a method of designing and manufacturing a solid-state electrochemical battery cell for a battery device. A database including various materials for solid-state battery and their material properties are provided. Based on the target battery performance requirement, the battery materials including anode, cathode, electrolyte and separator are selected from the database with given material properties and then subjected to an optimization procedure by varying the battery geometric factors. This invention relates to an approach to determine design and manufacturing factors for solid-state battery cell by the given material property data, which is less correlated to the development for the typical lithium ion battery.

In view of the above, there is always a need to find ways for designing and improving electrode materials for electrochemical cells, which provides a holistic solution to develop lithium ion batteries for various applications.

SUMMARY OF THE INVENTION

The aforementioned needs are met by various aspects and embodiments disclosed herein.

In one aspect, provided herein is a method of designing and modifying electrode materials for a battery device, comprising the steps of:

1) building a first model for the basic structure of the electrode material regarding to its composition and lattice type;

2) calculating a series of factors by the first model for material parameters that relate to battery structural stability, voltage and capacity;

3) selecting an electrode material structure based on the derived parameters for the potential battery application;

4) developing a second model for a battery cell based on the selected electrode material;

5) prioritizing the importance of the electrode material property parameters by simulating and comparing the cell charging and discharging behavior in the second model;

6) optimizing the prioritized electrode material properties in the second model according to the battery application requirement;

7) applying compositional and structural modifications in the first model based on the required electrode properties optimized in the step 6);

8) optimizing the modifications in the first model with regarding to both material parameters and cell performance;

9) synthesizing the modified electrode material as optimized in step 6) and 8);

10) validating the synthesized material properties by material testing;

11) fabricating a battery cell by using synthesize electrode material;

12) validating the synthesized material performance as battery electrode by testing the charging/discharging behavior of the battery cell.

In certain embodiments, the first model is an atomic scale model based on a first principal density function theory (DFT) or its equivalent.

In some embodiments, the electrode material is a cathode material and wherein the cathode material is selected from the group consisting of $LiCoO_2$, $LiNiO_2$, $LiNi_xMn_{1-x}O_2$, $Li_{1+z}Ni_xMn_yCo_{1-x-y}O_2$, $LiNi_xCo_yAl_{1-x-y}O_2$, $LiV_2O_5$, $LiTiS_2$, $LiMoS_2$, $LiMnO_2$, $LiCrO_2$, $LiMn_2O_4$, $LiFeO_2$ and combinations thereof, wherein each x is independently from 0.1 to 0.6; each y is independently from 0 to 0.8; and each z is independently from 0 to 0.6.

In certain embodiments, the factors calculated by the first model for material parameters is selected from the group consisting of lattice constant, slab thickness, system formation energy difference, lithium ion migration energy in the lattice, lithium ion diffusion pathway, lithium ion diffusivity in the lattice, lithium ion conductivity and specific heat capacity.

In some embodiments, in the selection of electrode material, the battery charging/discharging columbic efficiency can be evaluated by the slab thickness, the battery structural stability can be evaluated by the changes of lattice constant, lattice volume, and system energy in lithiation and delithiation, and the battery capacity can be evaluated by the lithium ion migration energy and lithium ion diffusivity.

In certain embodiments, the second model is a hybrid model comprising equivalent circuit model and geometric model with physical entities.

In some embodiments, the geometric model is pseudo 2-dimensional (P2D) model.

In certain embodiments, the second model comprises at least a battery cathode, a battery anode, a battery electrolyte, with the physical parameters selected form the group consisting of electrode composition, electrode active material concentration, electrode material particles size, electrode material packing density, lithium ion diffusivity in the electrode materials, lithium ion diffusivity in the electrolyte, lithium ion conductivity in the electrode materials, lithium ion conductivity in the electrolyte, and combinations thereof.

In some embodiments, the physical parameters in the second model are obtained either from the first model or from the testing of synthesized electrode material.

In some embodiments, the cell charging and discharging behavior will be estimated by the second model with the defined parameters.

In certain embodiments, the design optimization process in the second model comprises:

specifying the development objective variables for a lithium ion battery with regarding to the battery application requirements, including but not limited to cell capacity and cell voltage;

specifying the design parameters that can be adjusted in the second model and can be controlled in the material preparation procedure;

sampling plurality of design combinations in the specified design space for the for objective variables for each component of the second model with a design of experiment (DOE) approach;

conducting computer simulations of the second models on the design combinations to obtain data sets of optimization objectives of battery cell;

identifying an optimal set of design parameters of battery cell by evaluating the design objectives derived in the second model;

revising and repeating the optimization procedure above if the optimal solution can't be found in the above optimization steps.

In some embodiments, the modifications applied in the first model are element doping and surface capping of the battery electrode material.

In certain embodiments, the element doping modification in the first model is realized by the procedures of:

constructing a lattice unit of the original electrode material with sufficient lattice atoms that make sure the number of dopant element atom can be calculated in integer according to the designated doping concentration;

forming a series of revised models by randomly replacing the lattice elements with the dopant atoms according to the doping concentration and the structure symmetry;

calculating the system formation energies for each of the revised model;

prioritizing the possibilities of revised doping model by the formation energy and selecting the structure with the lowest formation energy as the doping model for further calculation.

In some embodiments, the modification applied in the first model further comprising a geometric optimization on the revised structure to achieve minimized system formation energy.

In certain embodiments, the doping element for the electrode modification is selected from the group consisting of Na, K, Mg, Al, Ti, V, Cr, Zn, Sr, Sn, Sb, W, Ce, Si, O, F, P, O, and combinations thereof.

In some embodiments, the property of synthesized material to be tested for validation comprises material particle size, material conductivity, material elemental composition, and lithium ion diffusivity in the material.

In certain embodiments, a half cell or full cell battery will be fabricated by using synthesize electrode material.

In some embodiments, the performance of synthesized material as battery electrode to be tested in a battery cell comprises specific capacity, cell voltage, charging/discharging behavior, cell rate capability, and cell capacity fading with charging/discharging cycling.

In certain embodiments, a databased is generated comprising the materials properties of basic electrode materials calculated by the first model for further modification and optimization.

In some embodiments, a computer program embedded in a non-transitory computer-readable storage medium, when executed by one or more processors, is used for conducting the calculation and simulation for electrode material and battery cell made thereof.

According to an embodiment of the present invention, a method of designing and modifying electrode materials for a battery device, the method including a hybrid model combining an atomic-level model and a battery-level model, and comprising steps of:

1) building the atomic-level model, based on a first principle density function theory (DFT) or molecular dynamics, for a basic structure of the electrode material regarding to its composition and lattice structure;
2) calculating a series of factors selected from the group consisting of at least one lattice constant, slab thickness, system formation energy difference, lithium ion migration energy in lattice, lithium ion diffusion pathway, lithium ion diffusivity in lattice, lithium ion conductivity and specific heat capacity;
3) correlating the factors calculated by the atomic-level model with battery performance including structural stability, voltage, capacity, rate capability, and/or cycle performance;
4) selecting an electrode material with a certain composition and structure based on results of the atomic-level model as obtained in the step 2) and the step 3) for a potential battery application;
5) developing the battery-level model, based on a pseudo 2-dimensional (P2D) model with physical entities or an equivalent circuit model, for a battery cell based on the selected electrode material;
6) prioritizing importance of electrode material physical parameters by simulating and comparing cell charging and discharging behavior calculated by the battery-level model;
7) optimizing the prioritized electrode material physical parameters in the battery-level model according to a battery application requirement;
8) applying compositional and structural modifications in the atomic-level model based on the electrode material physical parameters selected in the step 6);
9) optimizing the modifications in the atomic-level model with regarding to both the electrode material physical parameters and the battery performance; and
10) obtaining an optimal electrode material design for synthesizing electrode material as optimized in the step 7) and the step 9).
11) validating physical parameters of the synthesized electrode material by material characterization;
12) fabricating a battery cell, either a half cell or full cell, by using the synthesized electrode material; and
13) validating performance the synthesized electrode material as a battery electrode by testing charging/discharging behavior of the battery cell.

The present invention is a combination of different levels of battery modeling. Especially, one can calculate Li ion diffusivity, conductivity and thermodynamic properties of the electrode materials in atomic-level simulation and input these parameters into battery-level simulation. The hybrid model is used for selection, modification and optimization of electrode materials and the entire battery. The advantage of the hybrid model is to provide a balance between higher precision and higher calculation speed.

BRIEF DESCRIPTION OF THE DRAWINGS

FIG. 8A illustrates a structure of undoped spinel lithium manganese oxide ($LiMn_2O_4$) model for simulation in Example 3.

FIG. 8B illustrates a structure of Al-doped spinel lithium manganese oxide ($LiMn_2O_4$) model for simulation in Example 3.

FIG. 9 depicts cycling performance of electrochemical cells made from undoped and Al-doped spinel lithium manganese oxide synthesized according to the simulation in Example 3.

DETAILED DESCRIPTION OF THE INVENTION

Figure 1:
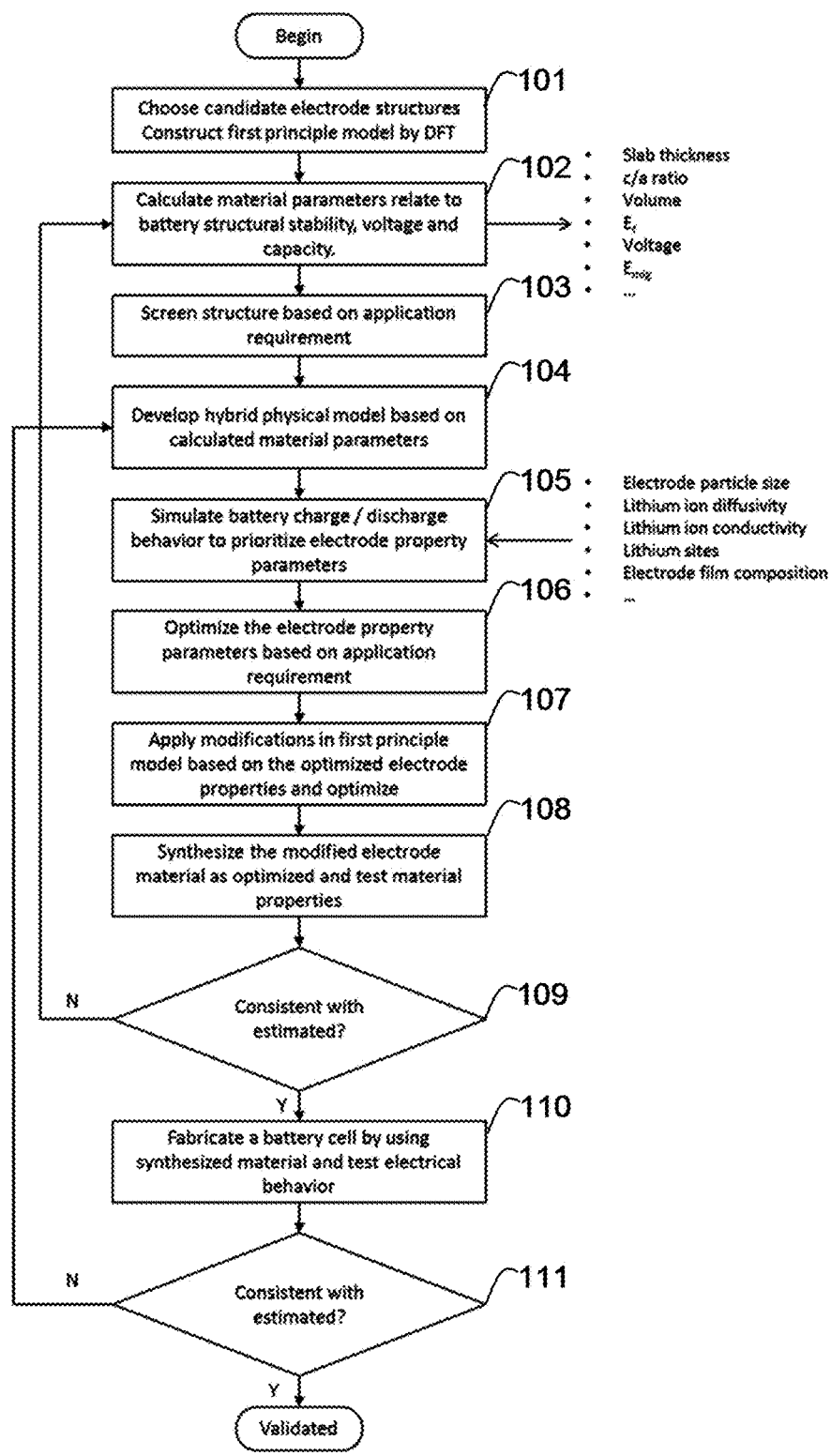
FIG. 1 illustrates a flow chart for the steps to design and modify an electrode material through computational approach in one embodiment of the method disclosed herein.

In the following description, a method of designing and modifying electrode materials for a battery device is set forth as preferred examples. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

The method includes constructing a first principle model for battery electrode material estimation and screening. The method also includes applying a structural and compositional modification on the first principle model. In some embodiments, the method includes developing a hybrid physical model to estimate the battery cell cycling behavior with the calculated and experimental parameters. The method and the simulation models have the advantage that both atomic level and physical structure are considered for the battery electrode and its modified derivatives with small compositional or structural changes. Therefore, both the time consumption and accuracy for battery electrode material designing and modification for specific application requirement can be improved.

Provided herein is a method of designing and modifying electrode materials for a battery device, comprising the steps of:
1) building a first model for the basic structure of the electrode material regarding to its composition and lattice type;
2) calculating a series of factors by the first model for material parameters that relate to battery structural stability, voltage and capacity;
3) selecting an electrode material structure based on the derived parameters for the potential battery application;
4) developing a second model for a battery cell based on the selected electrode material;
5) prioritizing the importance of the electrode material property parameters by simulating and comparing cell charging and discharging behavior in the second model;
6) optimizing the prioritized electrode material properties in the second model according to the battery application requirement;
7) applying compositional and structural modifications in the first model based on the required electrode properties optimized in the step 6);
8) optimizing the modifications in the first model with regarding to both material parameters and cell performance;
9) synthesizing the modified electrode material as optimized in step 6) and 8);
10) validating the synthesized material properties by material testing;
11) fabricating a battery cell by using synthesize electrode material;
12) validating the synthesized material performance as battery electrode by testing the charging/discharging behavior of the battery cell.

To facilitate the understanding of this invention, a number of terms are defined below.

The term "electrode" refers to a "cathode" or an "anode."

The term "applying" as used herein in general refers to an act of laying or spreading a substance on a surface.

The term "current collector" refers to a support for coating the active battery electrode material and a chemically inactive high electron conductor for keeping an electric current flowing to electrodes during discharging or charging a secondary battery.

The term "C rate" refers to the charging or discharging rate of a cell or battery, expressed in terms of its total storage capacity in Ah or mAh. For example, a rate of 1 C means utilization of all of the stored energy in one hour; a 0.1 C means utilization of 10% of the energy in one hour and the full energy in 10 hours; and a 5 C means utilization of the full energy in 12 minutes.

The term "ampere-hour (Ah)" refers to a unit used in specifying the storage capacity of a battery. For example, a battery with 1 Ah capacity can supply a current of one ampere for one hour or 0.5 A for two hours, etc. Therefore, 1 Ampere-hour (Ah) is the equivalent of 3600 coulombs of electrical charge. Similarly, the term "miniampere-hour (mAh)" also refers to a unit of the storage capacity of a battery and is $1/1{,}000$ of an ampere-hour.

The term "battery cycle life" refers to the number of complete charge/discharge cycles a battery can perform before its nominal capacity falls below 80% of its initial rated capacity.

In the following description, all numbers disclosed herein are approximate values, regardless whether the word "about" or "approximate" is used in connection therewith. They may vary by 1 percent, 2 percent, 5 percent, or, sometimes, 10 to 20 percent. Whenever a numerical range with a lower limit, $R^L$, and an upper limit, $R^U$, is disclosed, any number falling within the range is specifically disclosed. In particular, the following numbers within the range are specifically disclosed: $R=R^L+k*(R^U-R^L)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed.

FIG. 1 shows a flow chart for the steps to design and modify an electrode material through computational approach in one embodiment of the method disclosed herein. In step 101, candidate electrode structures are chosen and a first principle model is constructed by DFT. In step 102, material parameters related to battery structural stability, voltage, and capacity are calculated. The material parameters can be slab thickness, c/a ratio, volume, formation energy $E_f$, voltage, and migration barrier energy $E_{mig}$. In step 103, the structures are screened based on the application requirement. In step 104, a hybrid physical model is developed based on the calculated material parameters. In step 105, battery charge and discharge behavior is simulated to prioritize electrode property parameters. In step 106, the electrode property parameters are optimized based on the application requirement. In step 107, modification in first principle model is applied based on the optimized electrode properties and the first principle model is optimized. In step 108, the modified electrode material as optimized is synthesized and the material properties are tested. In step 109, the consistency of the synthesized materials with the estimated is checked. If they are not consistent, step 102 to step 108 are repeated in order to calculate a new set of the material parameters for estimation of material properties. Otherwise, a battery cell is fabricated by using the synthesized materials and the corresponding electrical behavior is tested in step 110. In step 111, the consistency of the electrical behavior of the fabricated battery cell with the estimated one is checked. If they are not consistent, step 104 to step 111 are repeated so as to develop a new hybrid physical model for estimation of the electrical behavior. Otherwise, the developed model is validated.

In the present method, the atomic level first principle models are constructed for common candidate electrode structures.

The structural and energy analysis are then performed in the model, wherein the material parameters relate to battery structural stability, voltage and capacity are then calculated. Some examples of the parameters include lattice constant, slab thickness, system formation energy difference, lithium ion migration energy in the lattice, lithium ion diffusion pathway, lithium ion diffusivity in the lattice, lithium ion conductivity and specific heat capacity. And a basic electrode structure which is more suitable to the potential application is then selected form the parameters calculated.

A hybrid model for a battery cell comprising the screened electrode material is further developed with material properties input either from the first principle simulation or from the experimental tests.

In certain embodiments, the hybrid model is based on pseudo 2-dimensional (P2D) physical model and equivalent circuit model.

In some embodiments, the physical model comprises at least a battery cathode, a battery anode, a battery electrolyte, with the physical parameters inputs from electrode composition, electrode active material concentration, electrode material particles size, electrode material packing density, lithium ion diffusivity in the electrode materials, lithium ion diffusivity in the electrolyte, lithium ion conductivity in the electrode materials, lithium ion conductivity in the electrolyte, and combinations thereof.

The battery charging/discharging behavior can then be simulated base on the hybrid model.

According to the simulation results, the physical parameters that relates to the electrode material properties in a cell structure are prioritized according to their effect on cell performance and optimized for specific performance targets regarding to the application requirements.

Modifications in first principle model based on the optimized electrode material physical parameters are then applied for designated performance.

In certain embodiments, the modification in the first principle model is realized by screening and ranking the randomly constructed structures according to the system formation energy.

In some embodiments, an element doping for the electrode modification is applied to improve the battery structural stability and rate capability.

The modified electrode materials optimized in the simulation is then synthesized with designated composition and structure. And material characterization will be conducted on the synthesized materials and comparing with the calculated results. Iterations of first principle simulation and material syntheses can be performed until a good consistency is achieved.

A half cell or full cell battery will be fabricated by using synthesize electrode material and tested for battery charging/discharging behavior and then compared with the calculated results. Iterations of hybrid model simulation and material syntheses can be performed until a good consistency is achieved which indicates a successful development of a modified electrode material.

The following examples are presented to exemplify embodiments of the invention but are not intended to limit the invention to the specific embodiments set forth. Unless indicated to the contrary, all parts and percentages are by weight. All numerical values are approximate. When numerical ranges are given, it should be understood that embodiments outside the stated ranges may still fall within the scope of the invention. Specific details described in each example should not be construed as necessary features of the invention.

EXAMPLES

Example 1

Simulation of Undoped and Mg Doped Li-Rich Layered Oxide (LLO)

Figure 2:
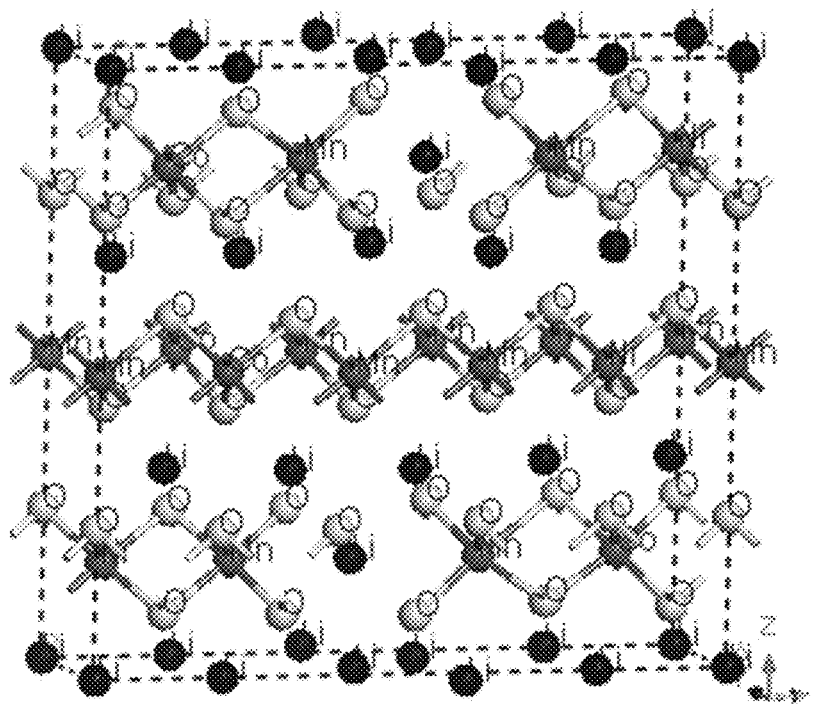
FIG. 2 illustrates a structure of undoped lithium multi-transition metal oxide (LNMC) model for simulation in Example 1.
Figure 3:
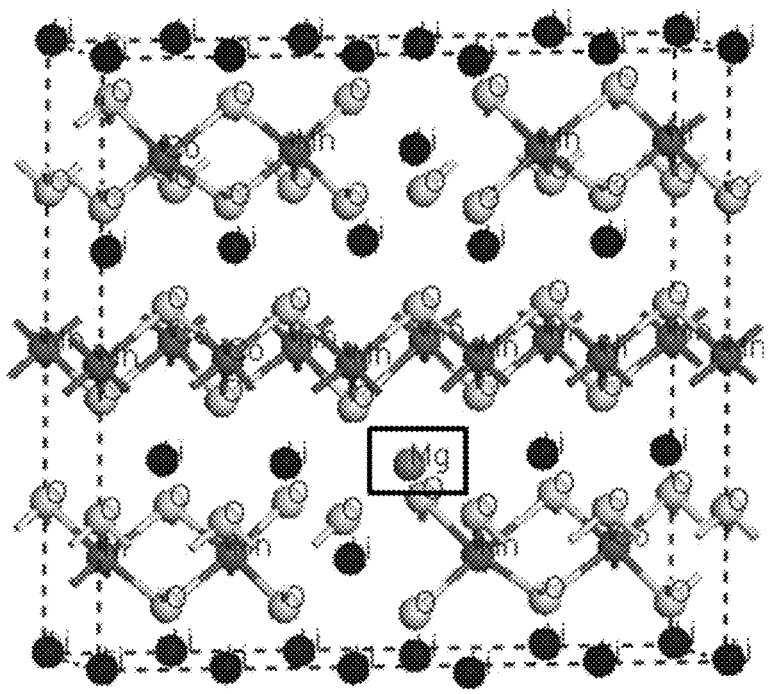
FIG. 3 illustrates a structure of Mg-doped lithium multi-transition metal oxide (LNMC) model for simulation in Example 1.
Figure 4:
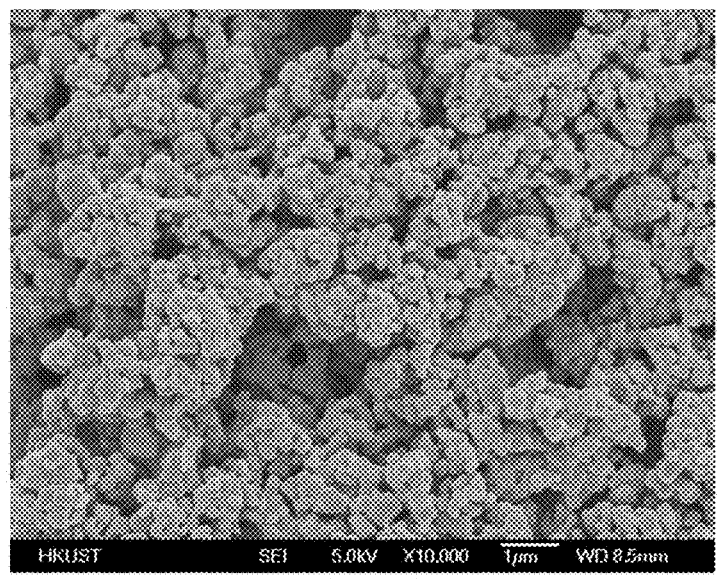
FIG. 4 depicts a SEM image of the synthesized undoped cathode ($Li_{1.4}Ni_{0.2}Co_{0.2}Mn_{0.6}O_{2.4}$) in Example 1.

First principle simulation based on Density Functional Theory (DFT) was conducted by using Material studio CASTEP. Trigonal system with space group of R-3M was constructed. Fractional coordinate for different elements are: Li (0, 0, 0), O (0, 0, 0.2594), transition metal (0, 0, 0.5). Transition metal elements include Ni, Co and Mn. Initial lattice constants were set as a=0.2823 nm and c=1.3890 nm. Then a super lattice was constructed by combining 5×1×1 unit cell. For the calculated Li-rich layered oxide, 2 Li atoms occupied transition metal position. In the super cell, there were totally 17 Li atoms, 3 Co atoms, 3 Ni atoms, 8 Mn atoms and 30 O atoms for the undoped LLO (FIG. 2). For the Mg doped LLO, one Li atom in the Li layer was replaced by Mg atom (FIG. 3).

Geometry optimization was conducted first with the function of General Gradient Approximation (GGA), cutoff energy of 950 eV, ultrasoft pseudopotential and spin polarization was considered. After geometry optimization, the structure with lowest energy was found, and the lattice constant (a and c), volume and energy of the system was given. Slab thickness was regarded as the ⅓ of c. Voltage generated from delithiation (relative to lithium metal anode) can be calculated from the energy difference from the material system before and after delithiation.

$$V = \frac{-\left[E_{Li_jNi_xCo_yMn_zO_2} - E_{Li_iNi_xCo_yMn_zO_2} - (j-i)E_{Li}\right]}{(j-i)e}$$

where e is the electron charge, $E_{Li}$ is the energy of Li atom and j-i is the number of Li atoms removed. For the doped LLO, Mg was not removed during delithiation. And the formation energy of Mg doped LLO was calculated by:

$$E_F = (E_{doped-LLO} + E_{Li}) - (E_{LLO} + E_{Mg}).$$

The migration energy $E_{mig}$ for Li ion diffusion from position A to B was calculated by transition state search. When Li ion moving from position A to B, other atoms were relaxed corresponding to the migrated Li ion and variation of the total energy were recorded against diffusion length so that the energy barrier on the diffusion path was obtained.

Simulation results of the undoped LLO and Mg doped LLO are listed in Table 1. Mg doped LLO shows larger slab thickness after delithiation (x=0) which is favorable for Li intercalation, and higher c/a ratio indicating a better layered structure. These could contribute to higher charge-discharge efficiency. Mg doped LLO also has smaller volume due to the shorter and stronger bond between transition metal and oxygen which can reduce oxygen loss and structure changes, and lower formation energy as compared to undoped LLO indicating more stable structure. These could contribute to better cycle performance. Finally, Mg doped LLO shows slightly higher voltage and lower migration energy (i.e. higher diffusivity). These could contribute to higher capacity.

TABLE 1 the simulation results for undoped
and Mg-doped LNMC in Example 1

|  | Li content | Undoped LLO | Mg doped LLO |
|---|---|---|---|
| Slab thickness (Å) | x = 1 | 5.044 | 4.999 |
|  | x = 0 | 4.944 | 5.026 |
| c/a ratio |  | 4.915 | 4.934 |
| Volume (Å$^3$) | x = 1 | 567.914 | 564.270 |
|  | x = 0 | 563.819 | 546.235 |
| E_f (eV) |  | — | -1.366 |
| Voltage (V) |  | 4.701 | 4.710 |
| E_mig (eV) |  | 0.285 | 0.044 |

Fabrication of Undoped LLO Cathode Material

Nickel-cobalt-manganese hydroxide (Ni—Co—Mn—OH) was prepared by a co-precipitation method using continuous stirred tank reactor (CSTR, capacity 2 L) under nitrogen atmosphere, in which the pH of the reactor was adjusted to 11 by using ammonium hydroxide. A metal salt aqueous solution which was prepared by dissolving 10.51 g of nickel sulphate with concentration of 0.04 mol/L, 11.24 g of cobalt sulphate with concentration of 0.04 mol/L and 20.28 g of manganese sulphate with concentration of 0.12 mol/L (cationic ratio of Ni:Co:Mn=1:1:3) in 250 mL distilled water was pumped into the reactor at a dosing rate of 1 L/h. At the same time, a precipitating solution which was prepared by dissolving 20.00 g of sodium hydroxide with concentration of 2 mol/L and 101.37 mL of ammonia was also pumped into reactor at a dosing rate of 1 L/h. The reaction was carried out at pH 11 with a stirring rate of 1000 rpm at 60° C. for 18 h. The obtained metal hydroxide was washed using distilled water and dried at 80° C. to obtain the precursor Ni—Co—Mn—OH. After that, the metal hydroxide powder was mixed thoroughly with 1.24 g of LiOH.H$_2$O (3% excess). The mixture was first heated to 450° C. in air for 6 h with heating rate of 5° C./min, and then annealed at 900° C. in air for 12 h with heating rate of 2° C./min to obtain the corresponding Li$_{1.4}$Ni$_{0.2}$Co$_{0.2}$Mn$_{0.6}$O$_{2.4}$ final product, and the particle was in nano size of 100-200 nm and a specific surface area of 1.2 m$^2$/g obtained by the BET method.

Fabrication of Mg-Doped LLO Cathode Material

The procedure of Example 1 was repeated, except that the precursor was mixed with magnesium oxide and LiOH for sintering. The added amount of MgO was 3% (0.094 g) by mole ratio. The magnesium was used to replace part of the lithium position to form as Li$_{1.37}$Ni$_{0.2}$Co$_{0.2}$Mn$_{0.6}$Mg$_{0.03}$O$_{2.4}$.

Electrochemical Measurements

The electrochemical performance of the cathode material of Example 1 was tested in CR2032 coin-type Li cells assembled in an argon-filled glove box. To fabricate the working electrode, a slurry consisting of 94 wt. % cathode material of Example 1, 3 wt. % carbon black, and 3 wt. % polyvinylidene fluoride (PVDF) dissolved in N-methyl-2-pyrrolidone (NMP) was casted on an aluminum as current collector and dried at 80° C. under vacuum for 5 h. After drying, the aluminum foil obtained was cut into disc-form electrode for coin cell assembly. A metal lithium foil having a thickness of 500 μm was served as negative electrode. The electrolyte was a solution of LiPF$_4$ (1 M) in a mixture of ethylene carbonate (EC), ethyl methyl carbonate (EMC) and dimethyl carbonate (DMC) in a volume ratio of 1:1:1.

The coin cells were analyzed in a constant current mode using a multi-channel battery tester (BTS-4008-5V10mA, obtained from Neware Electronics Co. Ltd, China). After 1 cycle at C/20 was completed, they were charged and discharged at a rate of C/2. The charging/discharging cycling tests of the cells were performed between 2.0 and 4.6 V with lithium foil as anode at a current density of C/2 at 25° C. on the multi-channel battery tester.

Figure 5:
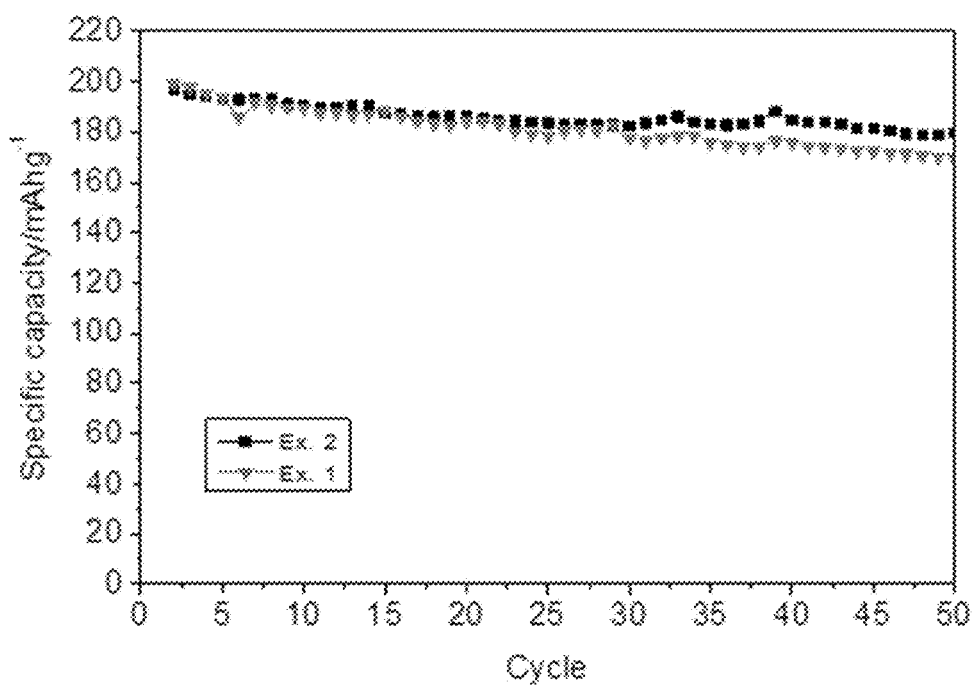
FIG. 5 depicts cycling performance of electrochemical cells made from undoped and Mg-doped cathodes synthesized according to the simulation in Example 1.

As a result, the discharge capacity retention of the Mg-doped positive electrode (Ex. 2) after 50 cycles is about 180 mAh/g which is higher than that of undoped positive electrode (Ex. 1) in about 170 mAh/g. Test result of Example 1 is shown in FIG. 5 and Table 2.

TABLE 2 the experimental testing results for undoped
and Mg-doped LNMC in Example 1

| No. | Mg doping ratio | 1$^{st}$ cycle charge/discharge efficiency | Specific capacity at 0.5° C. (mAh/g) | | Retention (%) |
|---|---|---|---|---|---|
| | | | Initial cycle | 50$^{th}$ cycle | |
| Ex. 1 | 0 | 72.7% | 200 | 170 | 85% |
| Ex. 2 | 3% | 79.5% | 198 | 180 | 91% |

Example 2

Simulation of Fe Doped Li-Rich Layered Oxide

Figure 6:
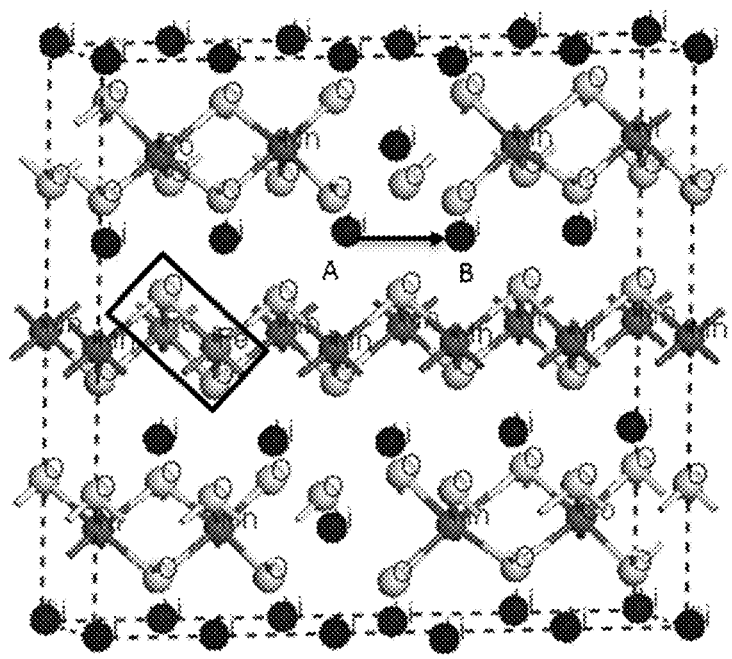
FIG. 6 illustrates a structure of Fe-doped lithium-rich layered oxide (LLO) model for simulation in Example 2.

The procedure of Example 1 was repeated, except that 1 Co atom was replaced by Fe atom (FIG. 6). The simulation results are shown in Table 3. Fe doped LLO shows larger slab thickness after delithiation (x=0) which is favorable for Li intercalation, and higher c/a ratio indicating a better layered structure. These could contribute to higher charge-discharge efficiency. Fe doped LLO also has smaller volume (x=1) due to the shorter and stronger bond between transition metal and oxygen which can reduce oxygen loss and structure changes, and lower formation energy as compared to undoped LLO indicating more stable structure. These could contribute to better cycle performance. Finally, Fe doped LLO shows much higher voltage and lower migration energy (i.e. higher diffusivity). These could contribute to higher capacity.

TABLE 3 the simulation results for undoped and Fe-doped LLO in Example 2

|  | Li content | Undoped LLO | Fe doped LLO |
|---|---|---|---|
| Slab thickness (Å) | x = 1 | 5.044 | 4.929 |
|  | x = 0 | 4.944 | 5.102 |
| c/a ratio |  | 4.915 | 4.920 |
| Volume (Å$^3$) | x = 1 | 567.914 | 562.727 |
|  | x = 0 | 563.819 | 574.484 |
| E_f (eV) |  | — | -3.130 |
| Voltage (V) |  | 4.701 | 4.806 |
| E_mig (eV) |  | 0.285 | 0.072 |

Li$_{1.4}$Ni$_{0.2}$Co$_{0.2-y}$Mn$_{0.6}$Fe$_y$O$_{2.4}$ Fabrication

The procedure of Example 1 was repeated, except that the iron sulphate was dissolved in the metal salt solution for co-precipitation as well. The added amount of iron sulphate was 3% (1.67 g) by mole ratio. The iron was used to replace part of the total transition metal position to form as Li$_{1.4}$Ni$_{0.2}$Co$_{0.17}$Mn$_{0.6}$Fe$_{0.03}$O$_{2.4}$.

Electrochemical Measurements

The electrochemical performance of the cathode material of Example 1 was tested in CR2032 coin-type Li cells assembled in an argon-filled glove box. To fabricate the working electrode, a slurry consisting of 94 wt. % cathode material of Example 1, 3 wt. % carbon black, and 3 wt. % polyvinylidene fluoride (PVDF) dissolved in N-methyl-2-pyrrolidone (NMP) was casted on an aluminum as current collector and dried at 80° C. under vacuum for 5 h. After drying, the aluminum foil obtained was cut into disc-form electrode for coin cell assembly. A metal lithium foil having a thickness of 500 μm was served as negative electrode. The electrolyte was a solution of $LiPF_4$ (1 M) in a mixture of ethylene carbonate (EC), ethyl methyl carbonate (EMC) and dimethyl carbonate (DMC) in a volume ratio of 1:1:1.

The coin cells were analyzed in a constant current mode using a multi-channel battery tester (BTS-4008-5V10mA, obtained from Neware Electronics Co. Ltd, China). After 1 cycle at C/20 was completed, they were charged and discharged at a rate of C/2. The charging/discharging cycling tests of the cells were performed between 2.0 and 4.6 V with lithium foil as anode at a current density of C/2 at 25° C. on the multi-channel battery tester.

Figure 7:
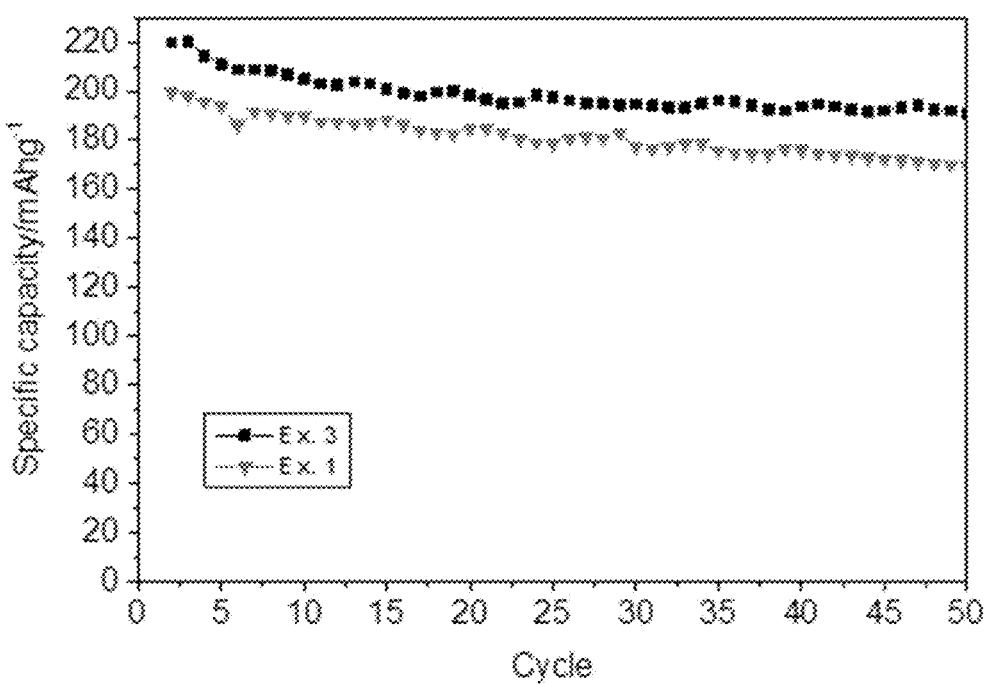
FIG. 7 depicts cycling performance of electrochemical cells made from undoped and Fe-doped cathodes synthesized according to the simulation in Example 2.

As a result, the discharge capacity retention of the Fe-doped positive electrode (Ex. 3) after 50 cycles is about 190 mAh/g which is higher than that of undoped positive electrode (Ex. 1) in about 170 mAh/g. Test result of Example 2 is shown in FIG. 7 and Table 4.

TABLE 4 the experimental testing results for undoped and Fe-doped LLO in Example 2

| No. | Fe doping ratio | $1^{st}$ cycle charge-discharge efficiency | Specific capacity at 0.5° C. (mAh/g) Initial cycle | Specific capacity at 0.5° C. (mAh/g) $50^{th}$ cycle | Retention (%) |
|---|---|---|---|---|---|
| Ex. 1 | 0 | 72% | 200 | 170 | 85% |
| Ex. 3 | 3% | 75% | 220 | 192 | 87% |

Example 3

Simulation of Undoped and Al Doped $LiMn_2O_4$

Cubic system with space group of FD-3M was constructed. Fractional coordinate for different elements are: Li (0.125, 0.125, 0.125), O (0.261, 0.261, 0.261), Mn (0.5, 0.5, 0.5). Initial lattice constants were set as a=0.8245 nm. In the unit cell, there were totally 8 Li atoms, 16 Mn atoms and 32 O atoms for the undoped $LiMn_2O_4$ (FIG. 8A). For the Al doping, one Mn atom was replaced by Al atom and another Mn atom was replaced by Li atom (FIG. 8B). The following simulation procedure was the same as in Example 1, except that cutoff energy of 900 eV was used.

The simulation results are shown in Table 5. Al doped $LiMn_2O_4$ shows smaller structure changes during delithiation and lower formation energy as compared to undoped $LiMn_2O_4$ indicating more stable structure. These could contribute to better cycle performance. Besides, Al doped $LiMn_2O_4$ shows much higher voltage. These could contribute to higher capacity.

TABLE 5 the simulation results for undoped and Al-doped $LiMn_2O_4$ in Example 3

| | Undoped $LiMn_2O_4$ | Al doped $LiMn_2O_4$ |
|---|---|---|
| Δa during delithiation | 0.84% | −0.27% |
| ΔV during delithiation | 2.48% | −1.65% |
| E_f (eV) | — | −34.04 |
| Voltage (V) | 3.95 | 5.23 |

$LiMn_2O_4$ Fabrication

Lithium manganese oxide ($LiMn_2O_4$) was prepared by solid state reaction method. 19.06 g of lithium carbonate with 3% lithium excess was mixed with 87.00 g manganese dioxide using the blender for homogenously mixing. The obtained mixture was first heated to 450° C. in air for 12 h with heating rate of 5° C./min, and then annealed at 900° C. for 20 h with heating rate of 2° C./min in air to obtain the corresponding product $LiMn_2O_4$.

$Li_{1+y}Mn_{2-x-y}Al_xO_4$ Fabrication

The procedure of Example 4 was repeated, except that the as obtain mixture was mixed with aluminum oxide for sintering. The added amount of $Al_2O_3$ was 2% (0.34 g) by mole ratio. The aluminum was used to replace part of the manganese position and lithium also replaced part of the manganese after doping to form as $Li_{1.09}Mn_{1.87}Al_{0.04}O_4$.

Electrochemical Measurements

The electrochemical performance of the cathode material of Example 1 was tested in CR2032 coin-type Li cells assembled in an argon-filled glove box. To fabricate the working electrode, a slurry consisting of 94 wt. % cathode material of Example 1, 3 wt. % carbon black, and 3 wt. % polyvinylidene fluoride (PVDF) dissolved in N-methyl-2-pyrrolidone (NMP) was casted on an aluminum as current collector and dried at 80° C. under vacuum for 5 h. After drying, the aluminum foil obtained was cut into disc-form electrode for coin cell assembly. A metal lithium foil having a thickness of 500 m was served as negative electrode. The electrolyte was a solution of $LiPF_4$ (1 M) in a mixture of ethylene carbonate (EC), ethyl methyl carbonate (EMC) and dimethyl carbonate (DMC) in a volume ratio of 1:1:1.

The coin cells were analyzed in a constant current mode using a multi-channel battery tester (BTS-4008-5V10mA, obtained from Neware Electronics Co. Ltd, China). After 1 cycle at C/20 was completed, they were charged and discharged at a rate of C/2. The charging/discharging cycling tests of the cells were performed between 2.0 and 4.6 V with lithium foil as anode at a current density of C/2 at 25° C. on the multi-channel battery tester.

As a result, the discharge capacity retention of the Al-doped positive electrode (Ex. 5) after 800 cycles is about 85 mAh/g which is higher than that of undoped positive electrode (Ex. 4) in about 60 mAh/g. Test result of Example 3 is shown in FIG. 9 and Table 6.

TABLE 6 the experimental testing results for undoped and Al-doped LiMn$_2$O$_4$ in Example 3

| No. | Fe doping ratio | 1$^{st}$ cycle charge-discharge efficiency | Specific capacity at 0.5° C. (mAh/g) | | Retention (%) |
|---|---|---|---|---|---|
| | | | Initial cycle | 50$^{th}$ cycle | |
| Ex. 1 | 0 | 72% | 200 | 170 | 85% |
| Ex. 3 | 3% | 75% | 220 | 192 | 87% |

TABLE 7 the 3 levels for the 4 factors studied by combining DoE and BDS in Example 4

| | Level 1 | Level 2 | Level 3 |
|---|---|---|---|
| Li site concentration (mAh/g) | 288 | 298 | 308 |
| Diffusivity (cm2/s) | 5e–15 | 1e–14 | 2e–14 |
| Particle size (nm) | 100 | 150 | 200 |
| Conductivity (S/cm) | 0.001 | 0.002 | 0.003 |

TABLE 8 the DoE parameter combinations and simulation results by the P2D model in Example 4

| No. | Li site mAh/g | Diffusivity cm$^2$/s | Particle nm | Conductivity S/cm | Capacity (mAh/g) | | |
|---|---|---|---|---|---|---|---|
| | | | | | 0.1 C | 0.5 C | 1 C |
| 1 | 288 | 5.00E–15 | 100 | 0.001 | 246.640 | 207.023 | 162.050 |
| 2 | 288 | 1.00E–14 | 150 | 0.002 | 245.468 | 201.346 | 153.476 |
| 3 | 288 | 2.00E–14 | 200 | 0.003 | 246.706 | 207.476 | 162.866 |
| 4 | 298 | 5.00E–15 | 150 | 0.003 | 243.391 | 162.006 | 106.541 |
| 5 | 298 | 1.00E–14 | 200 | 0.001 | 245.766 | 171.039 | 114.730 |
| 6 | 298 | 2.00E–14 | 100 | 0.002 | 262.929 | 252.844 | 240.210 |
| 7 | 308 | 5.00E–15 | 200 | 0.002 | 235.175 | 121.927 | 73.739 |
| 8 | 308 | 1.00E–14 | 100 | 0.003 | 269.406 | 249.645 | 224.934 |
| 9 | 308 | 2.00E–14 | 150 | 0.001 | 268.724 | 246.099 | 217.934 |

Example 4

Battery level simulation was conducted by Battery Design Studio (BDS). A simple half-cell was created. Cathode formulation was set as active material:PVDF:Super P=8:1:1. And properties for the active material were defined, including density of 4.7 g/cm$^3$, surface area of 6.3 m$^2$/g, molecular weight of 108 g/mol, lithium site concentration of 308 mAh/g, particle size of 0.15 μm, diffusion coefficient of 1e-14 cm$^2$/s, stoichiometry at formation of 0.1 and paste conductivity of 0.002 S/cm. The relationship between voltage and depth of discharge (DOD) was measured by hybrid pulse power characterization (HPPC) test. General electrolyte model and Distributed NP model were selected with electrode current density of 1 mA/cm, electrode tortuosity of 1, and electrolyte composition of IM LiPF$_6$ in the solvent of EC:EMC:DMC=1:1:1. Then the discharging curves at 0.1 C, 0.5 C and 1 C were calculated and specific capacity was obtained. Among previous sensitivity study, there were four factors found to have more clear influence on the specific capacity of the battery. Thus design of experiment (DoE) technique was combined with BDS to prioritize these input factors. There are 3 levels selected for each factor (Table 7). And orthogonal array of L$_9$(3$^4$) was used to reduce the number of simulations. Conditions for the 9 runs and specific capacity as the response are listed in Table 8.

Figure 10:
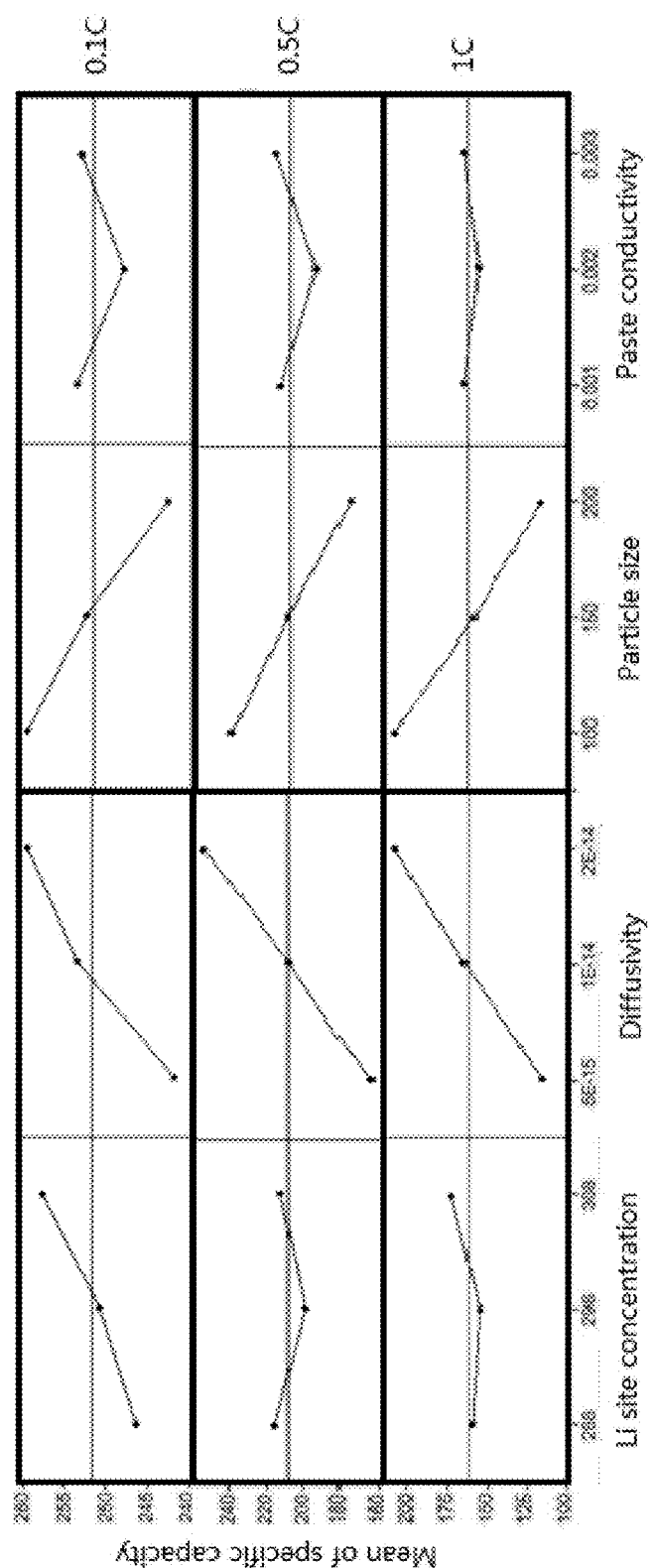
FIG. 10 depicts the main effect plot of the four factors on specific capacity at different C rate in Example 4.

By using ANOVA, response table for specific capacity at each C rate can be calculated. And ranking for the order of importance of the four factors are obtained from the response table and listed in Table 9. At different C rate, diffusivity and particle size are both identified as the most important factors. With higher diffusivity and smaller particle size, specific capacity tends to be higher (FIG. 10).

TABLE 9 the ranking of importance for the selected factors on the battery capacity obtained from simulation in Example 4

| | Rank | | |
|---|---|---|---|
| | 0.1 C | 0.5 C | 1 C |
| Li site | 3 | 4 | 3 |
| Diffusivity | 1 | 1 | 1 |
| Particle | 2 | 2 | 2 |
| Conductivity | 4 | 3 | 4 |

Figure 11:
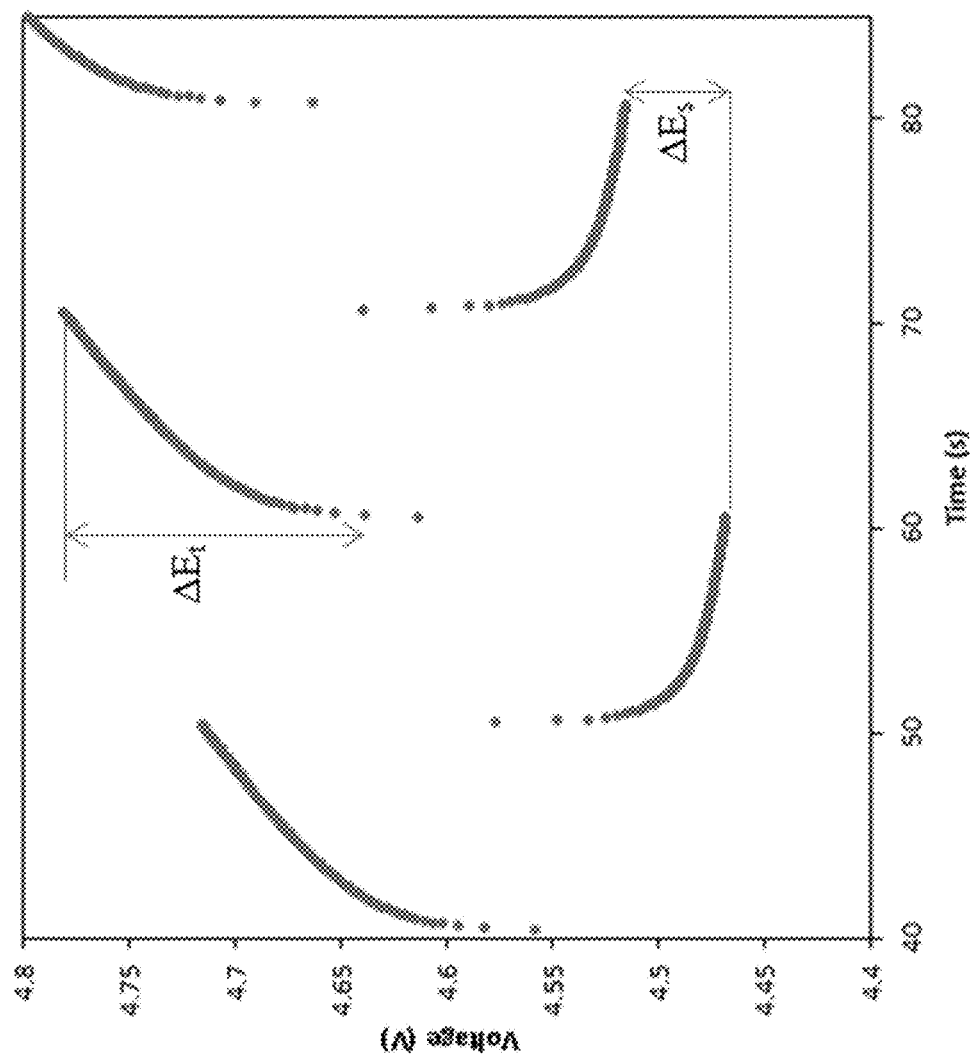
FIG. 11 illustrates $\Delta E_s$ and $\Delta E_t$ in two cycles of GITT results in Example 4.

Based on the simulation results, experiment 6, 7 and 8 were conducted. Procedures for fabrication of the cathode material and cell assembly were the same as in example 1, except that calcination temperature of 800° C. was used in experiment 6 and stirring rate of 800 rpm was used for experiment 7. Particle size was observed by using SEM. Diffusivity was measured by Galvanostatic Intermittent Titration Technique (GITT), where the cell fabricated by using the method stated in example 1 was cycled by charging for 10 min at 0.1 C and then rest for 10 min until 4.6V was reached. And diffusivity was calculated by the following equation $$D = \frac{4}{\pi\tau}\left(\frac{n_m V_m}{S}\right)^2\left(\frac{\Delta E_s}{\Delta E_t}\right)^2$$

where τ is the duration of the current pulse (s); nm is the number of moles (mol); $V_m$ is the molar volume of the electrode (cm³/mol); S is the electrode/electrolyte contact area (cm²); $\Delta E_s$ is the steady-state voltage change, due to the current pulse and $\Delta E_t$ is the voltage change during the constant current pulse, eliminating the iR drop (as shown in FIG. 11). The measured diffusivity and particle size are listed in Table 10. The specific capacity from measurement and simulation are also listed in Table 10. Comparing the results of experiment 6, 7 and 8, higher specific capacity can be obtained by optimizing diffusivity and particle size based on the prediction from simulation results.

TABLE 10 the comparison of experiment and simulation results for the optimization of particle size and diffusivity in Example 4

|  |  | Experiment 6 | Experiment 7 | Experiment 8 |
|---|---|---|---|---|
| Diffusivity (cm2/s) | | 2e−15 | 1e−14 | 1e−14 |
| Particle size (nm) | | 150 | 500 | 150 |
| Specific | 0.1 C | 210.5 (simulation) | 153.5 (simulation) | 254.4 (prediction) |
| Capacity | | 213.3 (measurement) | 146.8 (measurement) | 268.7 (measurement) |
| (mAh/g) | 0.5 C | 90.9 (simulation) | 48.9 (simulation) | 210.2 (prediction) |
| | | 83.5 (measurement) | 49.9 (measurement) | 209.9 (measurement) |
| | 1 C | 53.1 (simulation) | 29.6 (simulation) | 161.5 (prediction) |
| | | 21.2 (measurement) | 0.5 (measurement) | 160.0 (measurement) |

The embodiments disclosed herein may be implemented using a general purpose or specialized computing device, computer processor, or electronic circuitry including but not limited to a digital signal processor (DSP), application specific integrated circuit (ASIC), a field programmable gate array (FPGA), and other programmable logic device configured or programmed according to the teachings of the present disclosure. Computer instructions or software codes running in the general purpose or specialized computing device, computer processor, or programmable logic device can readily be prepared by practitioners skilled in the software or electronic art based on the teachings of the present disclosure.

In some embodiments, the present invention includes a computer storage medium having computer instructions or software codes stored therein which can be used to program a computer or microprocessor to perform any of the processes of the present invention. The storage medium can include, but is not limited to, floppy disks, optical discs, Blu-ray Disc, DVD, CD-ROMs, and magneto-optical disks, ROMs, RAMs, flash memory devices, or any type of media or device suitable for storing instructions, codes, and/or data.

While the invention has been described with respect to a limited number of embodiments, the specific features of one embodiment should not be attributed to other embodiments of the invention. In some embodiments, the methods may include numerous steps not mentioned herein. In other embodiments, the methods do not include, or are substantially free of, any steps not enumerated herein. Variations and modifications from the described embodiments exist. The appended claims intend to cover all those modifications and variations as falling within the scope of the invention.

What is claimed is:

1. A method of designing and modifying electrode materials for a battery device, the method including a hybrid model combining an atomic-level model and a battery-level model, and comprising steps of:
   1) building the atomic-level model, based on a first principle density function theory (DFT) or molecular dynamics, for a basic structure of the electrode material regarding to its composition and lattice structure;
   2) calculating a series of factors selected from the group consisting of at least one lattice constant, slab thickness, system formation energy difference, lithium ion migration energy in lattice, lithium ion diffusion pathway, lithium ion diffusivity in lattice, lithium ion conductivity and specific heat capacity;
   3) correlating the factors calculated by the atomic-level model with battery performance including structural stability, voltage, capacity, rate capability, and/or cycle performance;
   4) selecting an electrode material with a certain composition and structure based on results of the atomic-level model as obtained in the step 2) and the step 3) for a potential battery application;
   5) developing the battery-level model, based on a pseudo 2-dimensional (P2D) model with physical entities or an equivalent circuit model, for a battery cell based on the selected electrode material;
   6) prioritizing importance of electrode material physical parameters by simulating and comparing cell charging and discharging behavior calculated by the battery-level model;
   7) optimizing the prioritized electrode material physical parameters in the battery-level model according to a battery application requirement;
   8) applying compositional and structural modifications in the atomic-level model based on the electrode material physical parameters selected in the step 6);
   9) optimizing the modifications in the atomic-level model with regarding to both the electrode material physical parameters and the battery performance; and
   10) obtaining an optimal electrode material design for synthesizing electrode material as optimized in the step 7) and the step 9).

2. The method of claim 1, further comprising:
   11) validating physical parameters of the synthesized electrode material by material characterization;
   12) fabricating a battery cell, either a half cell or full cell, by using the synthesized electrode material;
   13) validating performance the synthesized electrode material as a battery electrode by testing charging/discharging behavior of the battery cell.

3. The method of claim 1, wherein the electrode material is a cathode material and wherein the cathode material is selected from the group consisting of $LiCoO_2$, $LiNiO_2$, $LiNi_xMn_{1-x}O_2$, $Li_{1+z}Ni_xMn_yCo_{1-x-y}O_2$, $LiNi_xCo_yAl_{1-x-y}O_2$, $LiV_2O_5$, $LiTiS_2$, $LiMoS_2$, $LiMnO_2$, $LiCrO_2$, $LiMn_2O_4$, $LiFeO_2$ and combinations thereof, wherein each x is independently from 0.1 to 0.6; each y is independently from 0 to 0.8; and each z is independently from 0 to 0.6.

4. The method of claim 1, wherein in the selection of electrode material of the step 4), a battery charging/discharging columbic efficiency is evaluated by the slab thickness, the battery structural stability is evaluated by the changes of lattice constant, lattice volume, and system energy in lithiation and delithiation, and the battery capacity are evaluated by the lithium ion migration energy and lithium ion diffusivity.

5. The method of claim 1, wherein the battery-level model comprises at least a battery cathode, a battery anode, a battery electrolyte, a separator, and a battery package, with the electrode material physical parameters, which are obtained either from the atomic-model or from testing results of synthesized electrode material, selected form the group consisting of electrode composition, Li ion and site concentration in electrode active material, electrode material particles size, electrode material packing density, lithium ion diffusivity in the electrode materials, lithium ion diffusivity in the electrolyte, lithium ion conductivity in the electrode materials, lithium ion conductivity in the electrolyte, and combinations thereof.

6. The method of claim 1, wherein design of the optimization process in the battery-level model of the step 6) and the step 7) comprises:
specifying output parameters for a lithium ion battery with regarding to the battery application requirement, including cell capacity and cell voltage;
specifying input parameters and their levels that are adjusted in the battery-level model and are controlled in a material preparation procedure;
sampling plurality of design combinations in specified design space for the output parameters for each component of the battery-level model with a design of experiment (DOE) approach;
conducting computer simulation of the battery-level models to obtain data sets of the output parameters for all of the design combinations;
identifying an order of importance and an optimal level of the input parameters by evaluating the output parameters derived in the battery-level model;
revising and repeating the optimization steps above if an optimal solution is not found in the above optimization steps.

7. The method of claim 1, wherein the compositional modification of the step 8) is an element doping modification in the atomic-level model realized by steps of:
constructing a lattice unit of an original electrode material with sufficient lattice atoms that make sure a number of dopant element atom be calculated in integer according to a designated doping concentration;
forming a series of revised models by randomly replacing the lattice elements with the dopant atoms according to the doping concentration and a structure symmetry;
calculating system formation energies for each of the revised model;
prioritizing possibilities of the revised doping model by the formation energy and selecting a structure with the lowest formation energy as the doping model for further calculation.

8. The method of claim 7, wherein the doping element for the electrode modification of the step 8) is selected from the group consisting of Na, K, Mg, Al, Ti, V, Cr, Zn, Sr, Sn, Sb, W, Ce, Si, O, F, P, O, and combinations thereof.

9. The method of claim 2, wherein the physical parameters of the synthesized electrode material to be tested for validation of the step 11) comprises material particle size, material conductivity, material elemental composition, and/or lithium ion diffusivity in the material.

10. The method of claim 2, wherein the performance of synthesized electrode material as battery electrode to be tested in the battery cell of the step 13) comprises specific capacity, cell voltage, charging/discharging behavior, cell rate capability, and/or cell capacity fading with charging/discharging cycling.

11. The method of claim 2, further comprising generating a database comprising the factors calculated by the atomic-level model and material physical parameters of basic electrode materials for further modification and optimization.

12. The method of claim 1, wherein a computer program embedded in a non-transitory computer-readable storage medium, when executed by one or more processors, is used for conducting the calculation and the simulation for the electrode material and a battery cell made thereof.

13. A computer-readable medium whose contents cause a computing system to perform the method of claim 1.

14. A computer-readable medium whose contents cause a computing system to perform the method of claim 2.

* * * * *